US009759884B2

(12) United States Patent
Coffey et al.

(10) Patent No.: US 9,759,884 B2
(45) Date of Patent: Sep. 12, 2017

(54) TELECOMMUNICATIONS CABINET MODULARIZATION

(71) Applicant: CommScope Technologies LLC, Hickory, NC (US)

(72) Inventors: Joseph C. Coffey, Burnsville, MN (US); Paul John Pepe, Clemmons, NC (US)

(73) Assignee: CommScope Technologies LLC, Hickory, NC (US)

( * ) Notice: Subject to any disclaimer, the term of this patent is extended or adjusted under 35 U.S.C. 154(b) by 0 days.

(21) Appl. No.: 15/095,619

(22) Filed: Apr. 11, 2016

(65) Prior Publication Data

US 2017/0038548 A1 Feb. 9, 2017

Related U.S. Application Data

(63) Continuation of application No. 13/939,407, filed on Jul. 11, 2013, now Pat. No. 9,310,577.

(60) Provisional application No. 61/670,414, filed on Jul. 11, 2012.

(51) Int. Cl.
| | |
|---|---|
| *G02B 6/44* | (2006.01) |
| *H05K 5/02* | (2006.01) |
| *H05K 7/14* | (2006.01) |
| *H05K 7/18* | (2006.01) |

(52) U.S. Cl.
CPC ........... *G02B 6/4452* (2013.01); *G02B 6/444* (2013.01); *H05K 5/0247* (2013.01); *H05K 7/1427* (2013.01); *H05K 7/186* (2013.01)

(58) Field of Classification Search
CPC .... G02B 6/444; G02B 6/4452; H05K 5/0247; H05K 7/1427; H05K 7/186
See application file for complete search history.

(56) References Cited

U.S. PATENT DOCUMENTS

| | | | |
|---|---|---|---|
| 2,773,940 A | 12/1956 | Lebedinsky | |
| 3,833,840 A | 9/1974 | Sinden | |
| 4,989,317 A | 2/1991 | Firl et al. | |
| 5,175,673 A | 12/1992 | Roger et al. | |
| 5,216,579 A * | 6/1993 | Basara | G06F 1/184 |
| | | | 174/481 |
| 5,323,454 A | 6/1994 | Shay et al. | |
| 5,448,675 A | 9/1995 | Leone et al. | |
| 5,461,693 A | 10/1995 | Pimpinella | |
| 5,566,836 A | 10/1996 | Lerman | |
| 5,659,648 A | 8/1997 | Knapp et al. | |
| 5,712,942 A | 1/1998 | Jennings et al. | |
| 5,793,909 A | 8/1998 | Leone et al. | |
| 5,901,033 A | 5/1999 | Crawford et al. | |
| 6,175,079 B1 | 1/2001 | Johnston et al. | |

(Continued)

OTHER PUBLICATIONS

Wikipedia, Kapton, Sep. 3, 2014, 4 pages.

(Continued)

*Primary Examiner* — Peter Radkowski
(74) *Attorney, Agent, or Firm* — Merchant & Gould P.C.

(57) ABSTRACT

An example telecommunications cabinet includes: an enclosure including sidewalls extending between a bottom of the enclosure and a top of the enclosure to define an interior of the enclosure; telecommunications equipment disposed within the interior of the enclosure; and a data distribution arrangement disposed on one of the sidewalls within the interior of the enclosure.

9 Claims, 8 Drawing Sheets

(56) References Cited

U.S. PATENT DOCUMENTS

| | | |
|---|---|---|
| 6,215,938 B1 | 4/2001 | Reitmeier et al. |
| 6,487,356 B1 | 11/2002 | Harrison et al. |
| 6,489,565 B1 | 12/2002 | Krietzman et al. |
| 6,587,630 B2 | 7/2003 | Spence et al. |
| 6,616,344 B1 | 9/2003 | Van Deventer |
| 6,760,531 B1 | 7/2004 | Solheid et al. |
| 6,870,095 B1 | 3/2005 | Whitted |
| 6,885,564 B2 | 4/2005 | Hockett |
| 7,142,764 B2 | 11/2006 | Allen et al. |
| 7,188,415 B2 | 3/2007 | Robinson et al. |
| 7,233,731 B2 | 6/2007 | Solheid et al. |
| 7,315,681 B2 | 1/2008 | Kewitsch |
| 7,439,449 B1 | 10/2008 | Kumar et al. |
| 7,760,516 B2 | 7/2010 | Johnson, Jr. et al. |
| 8,014,171 B2 | 9/2011 | Kelly et al. |
| 8,410,364 B2 | 4/2013 | Dunwoody et al. |
| 8,576,580 B2 | 11/2013 | Kelly et al. |
| 2003/0194187 A1 | 10/2003 | Simmons et al. |
| 2004/0114326 A1 | 6/2004 | Dodgen et al. |
| 2005/0220393 A1 | 10/2005 | Riester et al. |
| 2006/0275007 A1* | 12/2006 | Livingston ........... G02B 6/3831 385/134 |
| 2007/0165995 A1* | 7/2007 | Reagan ................ G02B 6/4452 385/135 |
| 2008/0151524 A1 | 6/2008 | Kelly et al. |
| 2008/0247723 A1 | 10/2008 | Herzog et al. |
| 2009/0236117 A1 | 9/2009 | Garza et al. |
| 2009/0245743 A1* | 10/2009 | Cote ................... G02B 6/4454 385/135 |
| 2009/0283488 A1 | 11/2009 | McMillan, III et al. |
| 2010/0006317 A1 | 1/2010 | Hruby et al. |
| 2010/0027953 A1 | 2/2010 | Russell |
| 2011/0044020 A1 | 2/2011 | Hruby et al. |
| 2011/0192631 A1 | 8/2011 | Burek et al. |
| 2011/0286198 A1 | 11/2011 | Kelly et al. |
| 2011/0299822 A1* | 12/2011 | Barry .................. G02B 6/4452 385/135 |
| 2012/0019177 A1 | 1/2012 | Kaufmann et al. |

OTHER PUBLICATIONS

Commscope, Cabling Solutions/Patching Solutions, InstaPATCH® Plus & G2 Solutions, May 18, 2012 (as cached on www.archive.org), 2 pages.

ADC, TE connectivity, Quareo Physical Layer Management, Copyright 2014, 2 pages.

International Search Report and Written Opinion in PCT/US2013/050110 mailed Oct. 22, 2013, 11 pages.

* cited by examiner

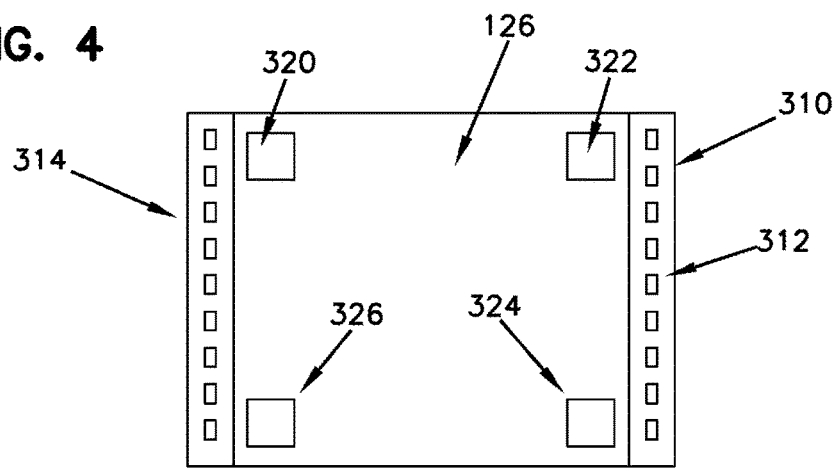
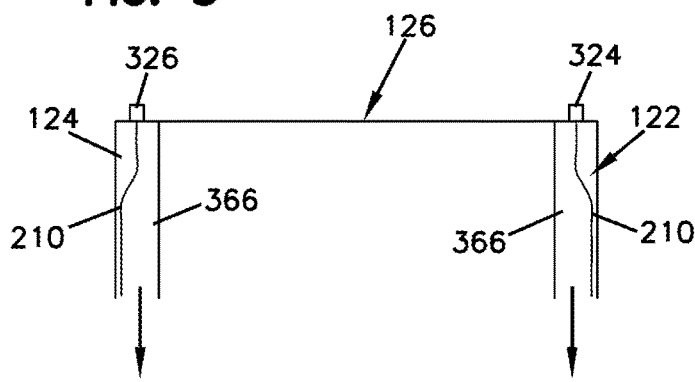
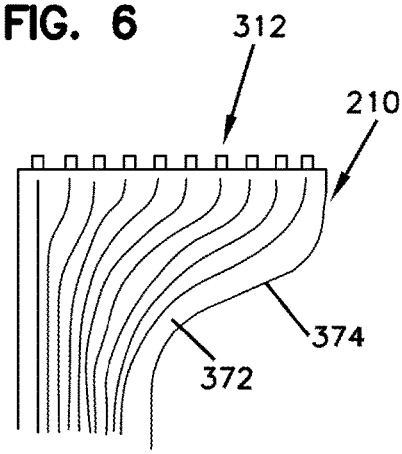
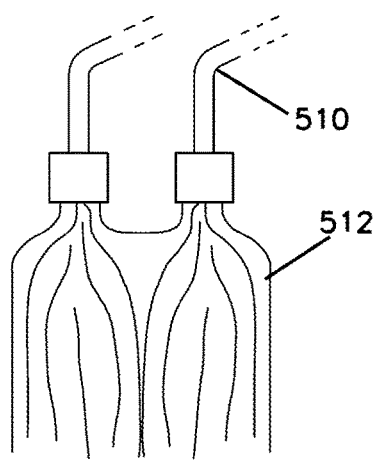

TELECOMMUNICATIONS CABINET MODULARIZATION

CROSS-REFERENCE TO RELATED APPLICATION

The present patent application claims the benefit of U.S. Provisional Patent Application Ser. No. 61/670,414, filed Jul. 11, 2012, which application is hereby incorporated by reference in its entirety.

BACKGROUND

Telecommunications cabinets are used to hold equipment used in fiber optic and electrical networks. The equipment can be used to split and switch connections between origins and terminations. The equipment can perform other functions as well, such as to add power in Power-Over-Ethernet networks.

Fiber optic cables are typically run into and out of the cabinet to terminate with the equipment in the cabinet. Further, jumper cables can be used to make connections between different equipment within the cabinet. Excess cable can be looped and housed within the cabinet until needed. Heat generated by the equipment can be significant within the cabinet. The amount of cable run within the cabinet can disrupt cooling, thereby exacerbating the heating problems.

SUMMARY

In one aspect, an example telecommunications cabinet includes: an enclosure including sidewalls extending between a bottom of the enclosure and a top of the enclosure to define an interior of the enclosure; telecommunications equipment disposed within the interior of the enclosure; and a data distribution arrangement disposed on one of the sidewalls within the interior of the enclosure.

In another aspect, a telecommunications cabinet includes: an enclosure including sidewalls extending between a bottom of the enclosure and a top of the enclosure to define an interior of the enclosure; telecommunications equipment disposed within the interior of the enclosure; an optical flexible foil cable disposed on one of the sidewalls within the interior of the enclosure, wherein the optical flexible foil cable is formed from a flexible polycarbonate material; wherein the optical flexible foil cable extends from the top of the enclosure through one of the sidewalls towards the bottom.

In yet another aspect, a method of distributing cables in a telecommunications cabinet includes: providing an enclosure including sidewalls extending between a bottom of the enclosure and a top of the enclosure to define an interior of the enclosure; positioning telecommunications equipment within the interior of the enclosure; and running a cable from the top of the enclosure, through the sidewalls within the interior of the enclosure, and to the telecommunications equipment.

DESCRIPTION OF THE DRAWINGS

FIG. 4 is a schematic view of an example top wall of the cabinet of FIG. 1.

FIG. 5 is a front view of a portion of the cabinet of FIG. 1.

FIG. 6 is a side view of example cabling provided within the cabinet of FIG. 1.

FIG. 7 is a side view of example cabling provided within the cabinet of FIG. 1.

DETAILED DESCRIPTION

Figure 1:
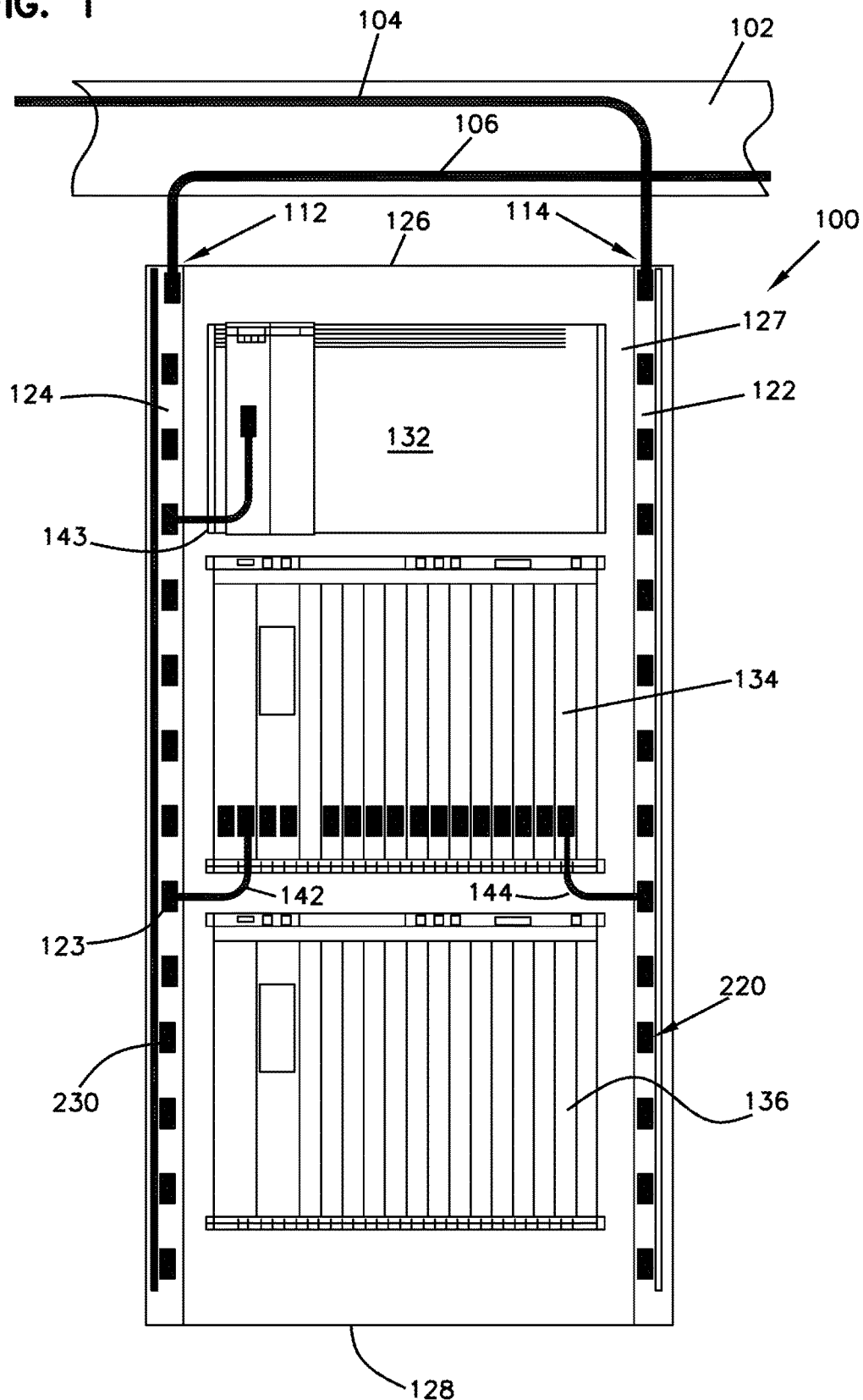
FIG. 1 is a front view of an example telecommunications cabinet.
Figure 2:
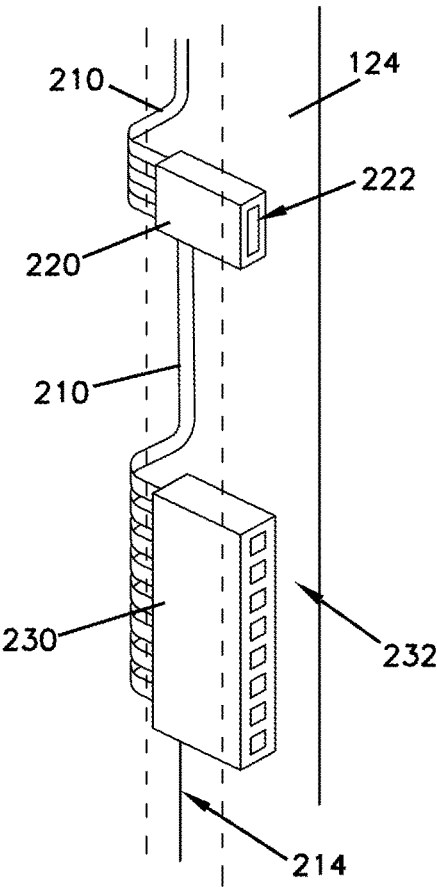
FIG. 2 is a perspective view of example cabling provided within the cabinet of FIG. 1.
Figure 3:
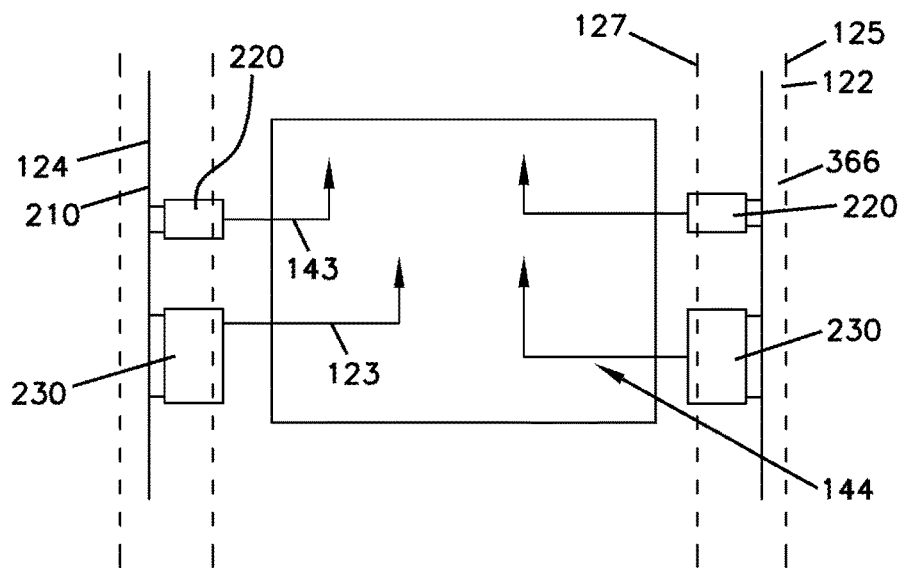
FIG. 3 is a schematic view of example cabling provided within the cabinet of FIG. 1.

The present disclosure is directed towards configurations for cabinets for telecommunications equipment. Although not so limited, an appreciation of the various aspects of the present disclosure will be gained through a discussion of the examples provided below.

FIGS. 1-5 illustrate one example embodiment for a telecommunications cabinet 100. In this example, the cabinet 100 includes a top wall 126, a bottom wall 128, and side walls 122, 124. A front wall (not shown) is also typically included so that the cabinet 100 provides an enclosed environment for telecommunications equipment.

In the example shown, telecommunications equipment 132, 134, 136 is provided within the cabinet 100. The equipment 132, 134, 136 can perform various tasks, such as splitting and/or routing optical and electrical connections from an origin to a destination. The equipment 132, 134, 136 can also perform such tasks as injecting power in a Power-Over-Ethernet environment. Other configurations are possible.

The telecommunications equipment 132, 134, 136 must be connected with a plurality of cables (fiber and/or electrical) to perform these functions. In this example, cables 104, 106 are routed from a fiber guide system 102 located above the cabinet 100. The cables 104, 106 are terminated at the top wall 126 of the cabinet 100.

As shown in FIG. 4, the top wall 126 includes modules 310, 314 with a plurality of ports 312 provided therein. Each of the ports 312 can terminate a fiber and/or electrical connection. The ports 312 can be used to make connections with the equipment 132, 134, 136 located within the cabinet 100, as described further below. The ports 312 can provide data and/or power to the equipment 132, 134, 136.

In one example, the modules 310, 314 are equipped with connection point identification technology (CPID) so that information contained in integrated circuit boards on the connectors connected to the modules 310, 314 is communicated to the equipment 132, 134, 136. One example of such CPID technology is the Quareo Technology provided by TE Connectivity of Berwyn, Pa.

In this example, the ports 312 can accept a variety of connectors. For example, fiber connectors can include an LC connector, although other connector types can be used. For example, in alternative embodiments, SC, MU, or LX.5 connectors can be used, such as that illustrated in U.S. Pat. No. 6,629,782.

The top wall 126 also includes ports 320, 322, 324, 326 that perform various other functions. In this example, the ports 320, 322 are power ports that connect with electrical cables to provide power to the equipment 132, 134, 136 within the cabinet 100.

The ports 324, 326 are optical CPID ports that allow the cabinet 100 to be connected with other equipment, such as other cabinets of similar configuration. In this example, the cabinet 100 can be connected to a network having various configurations. For example, wired to other cabinets to provide interconnections therebetween. In another example, each cabinet can be wired to a switch matrix or patch panel to provide connectivity between cabinets.

Referring to FIGS. 1-3 and 5, the side walls 122, 124 define passages 366 through which cabling 210 is run from the top wall 126 to the equipment 132, 134, 136 within the cabinet 100. In example embodiments, the sidewalls 122, 124 can be formed of two or more panels 125, 127 that together form the passage 366 therethrough. The passage 366 can be partially and/or completely enclosed as the side walls 122, 124 extend from the top wall 126 to the bottom wall 128. Other configurations can be used to form the passage 366. For example, in alternative embodiments, the passage 366 can be formed by other structures, such as beams with hollow interiors that are used to form portions of the side walls 122, 124.

Specifically, cables that originate from the modules 310, 314 and ports 320, 322, 324, 326 on the top wall 126 are run through the side walls 122, 124. In this example, the cabling can be a dense-type cabling, such as multi-mode and/or single mode fibers that have been embedded in a flexible foil structure. The foil structure can be made of various materials, such as a polycarbonate or a polyimide film, such as Kapton® polyimide film made by DuPont of Wilmington, Del. The foil allows for increased density when running a plurality of fibers while minimizing heat.

The cabling 210 is terminated along the side walls 122, 124 at modules 220, 230 that include ports 222, 232. The modules 220, 230 can be of different types. For example, in this illustration, the port 222 on the module 220 is an MTP port, and the ports 232 on the module 230 are LC ports. Other configurations are possible.

Short jumper cables 123, 143, 144 can be connected from the modules 220, 230 to ports located on the equipment 132, 134, 136 within the cabinet 100. By optimizing (i.e., minimizing) the size of the jumper cables 123, 143, 144, any slack within the cabinet is minimized. For example, the jumper cables 123, 143, 144 can be provided in different sizes so that the correct size can be used to route a jumper cable from a particular port on the side wall 122, 124 to a particular port on the equipment 132, 134, 136. In this manner, excess cable within the cabinet 100 is minimized.

In addition to running fiber through the side walls 122, 124, electrical cabling can also be provided through the side walls 122, 124. For example, electrical wires providing data and/or power can be run through the side walls 122, 124 to terminations within the cabinet 100.

Referring now to FIGS. 6 and 7, examples of the cabling 210 are shown. In FIG. 6, the cabling 210 includes the foil 372 in which optical fibers 374 are embedded. The foil 372 is flexible so that it can be positioned within the passages 366 to run from the top wall 126 to the bottom wall 128. The foil 372 expands at the top to provide connections with the modules located at the top wall 126. The foil 372 tapers into a more compact structure as the foil extends from the top wall 126 to allow for a greater density of cabling within the passages 366.

In FIG. 7, an alternative configuration for the cabling is shown. In this example, circular cables 510 are fed into a convex foil 512 that is extended through the passages 366. Other configurations are possible. Further, as noted previously, the foil can be used to carry both data and/or power.

Figure 8:
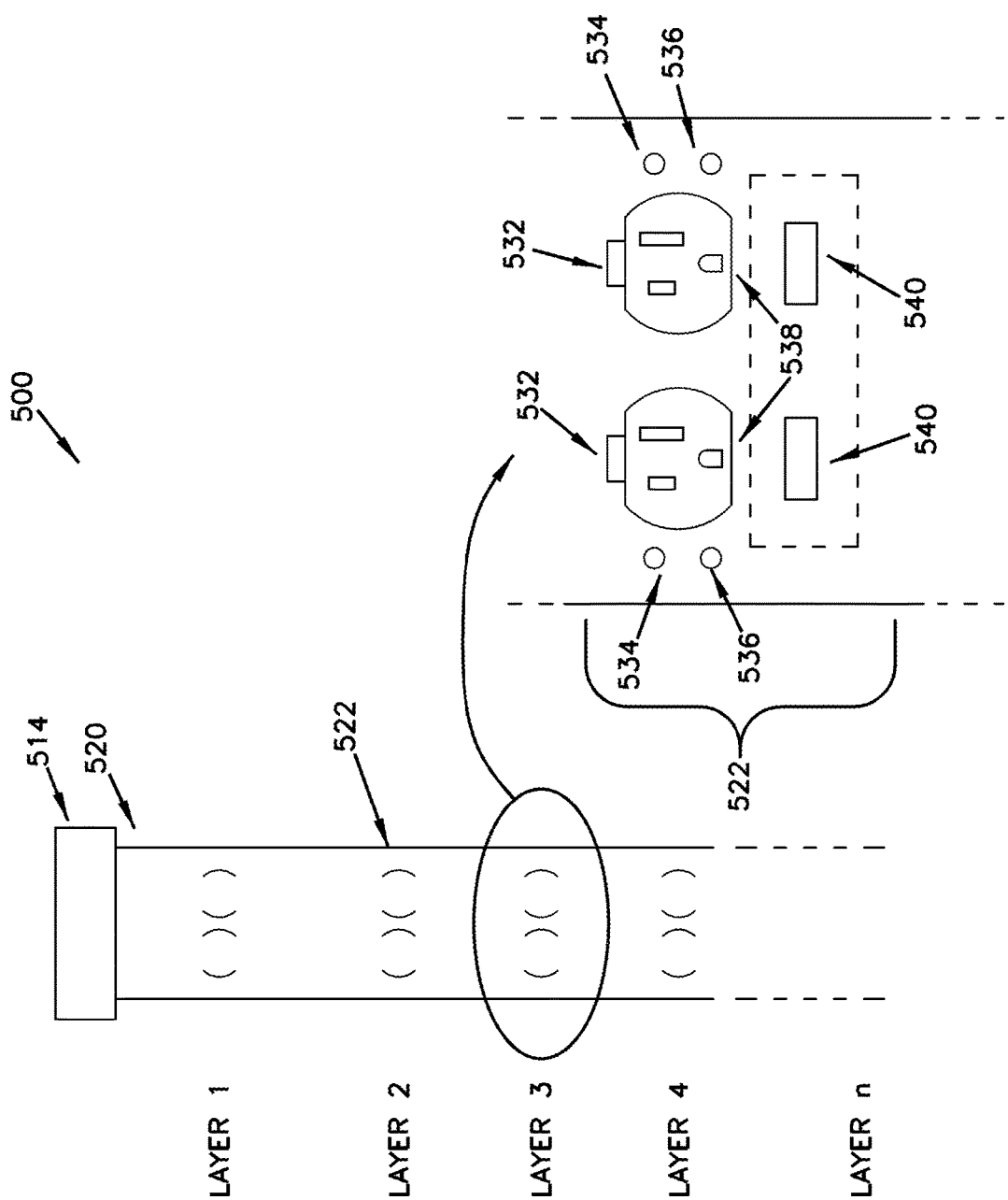
FIG. 8 is a side view of example cabling provided within the cabinet of FIG. 1.

For example, referring now to FIG. 8, an example flat power cable 500 is shown. The cable 500 is configured to be run within the passages 366 on the side walls 122, 124.

The cable 500 includes a module 514 that is positioned at the top wall 126 so that external cabling can be connected thereto. A flat cable 520 extends from the module 514. In this example, the flat cable 520 is a multi-layered cable wrapped in a polymeric housing. Multiple wires can be run therethrough while maintaining optimal density and thermal characteristics.

The cable 520 is terminated at a plurality of connections 522. In the example shown, one or more of the connections 522 includes a port interface 532, such as a Quareo CPID interface shown in FIG. 8. The connection 522 also includes indicator lights 534, 536 for each electrical outlet 538. In this example, the lights 534, 536 are LEDs, with the light 534 indicating voltage within specified limits (e.g., for a Power-Over-Ethernet implementation) for the outlet 538, and the light 536 indicates that the electrical outlet 538 is active (e.g., by sensing a current at the outlet). Each outlet 538 can also include a removable fuse 540.

Figure 9:
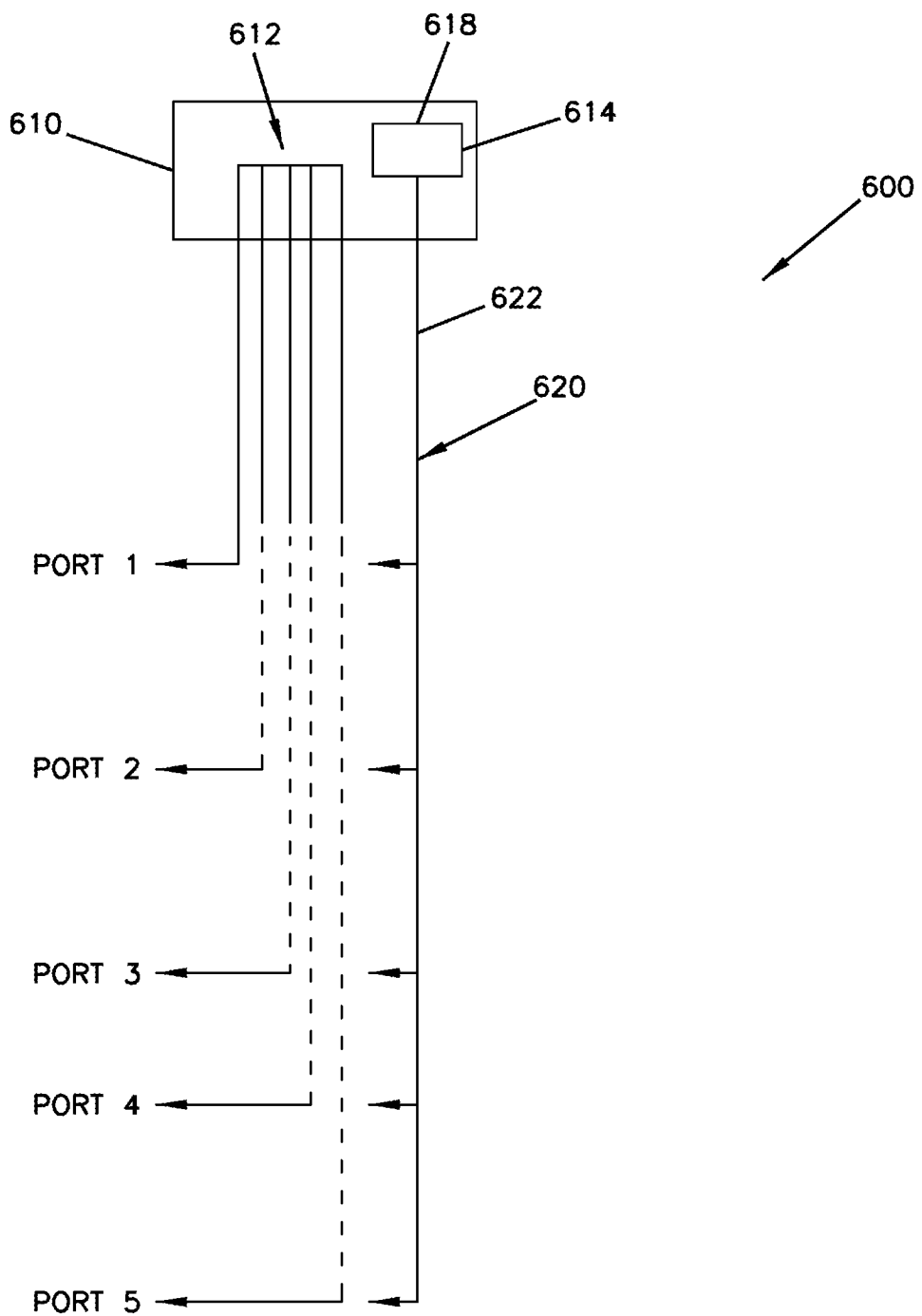
FIG. 9 is a side view of example cabling provided within the cabinet of FIG. 1.

Referring now to FIG. 9, another example cable 600 is shown. The cable 600 provides both control and monitoring on the ports 1-5. Specifically, the cable 600 includes a control module 614 that communicates on a wire 622. The control module 614 can function to provide control and monitoring of the ports, such as CPID, LED signaling, and current sensing. A power bus 612 provides power to each of the ports. The wire 622 and the bus 612 are both run through a flexible foil 620 made of a material like Kapton® polyimide film.

In example embodiments, the control module 614 can include various logical components. For example, the control module 614 can include a microprocessor to control monitoring of the network. The control module 614 can include storage and one or more removable storage devices (e.g., an SD Card port) that allows for event-related storage. The control module 614 can include communications circuitry that allows the control module 614 to communicate with the remainder of the network using Ethernet.

Each example port can also include enhanced functionality, including providing power in the Power-Over-Ethernet implementations. A microprocessor, such as a 16-bit DSP, can also be provided to perform functions like voltage and current sensing at the port. Other configurations are possible.

Figure 10:
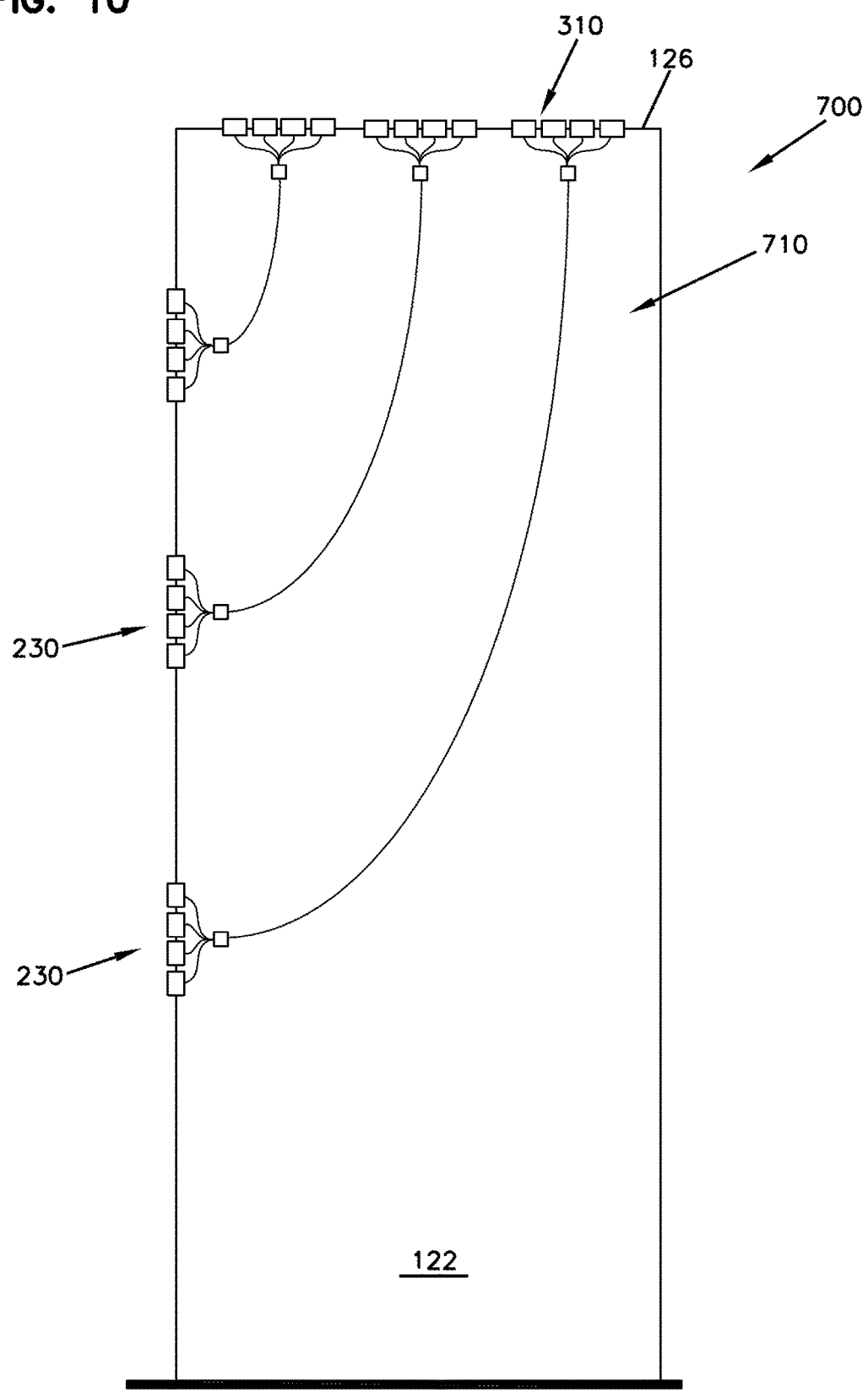
FIG. 10 is a side view of another example telecommunications cabinet.

Referring now to FIG. 10, another example telecommunications cabinet 700 is shown. The cabinet 700 is similar to the cabinet 100 described above. However, the cabling 710 run within the side walls 122, 124 of the cabinet 700 includes MPO cables that extend from the modules 310 in the top wall 126 to modules 230 in the side walls 122, 124. The modules 230 include LC ports, so that data that is transmitted from ports in the modules 310 is terminated in the LC ports in the modules 230. The cabling 710 can be provided on a single plane to allow for maximization of air flow.

In alternative designs, electrical cables can be run. For example, the cabling could be MRJ21 cables that extend from the modules 310 in the top wall 126 to modules 230 in the side walls 122, 124. The modules 230 could include RJ45 ports, so that data is transmitted from ports in the modules 310 is terminated in the RJ45 ports in the modules 230.

Figure 11:
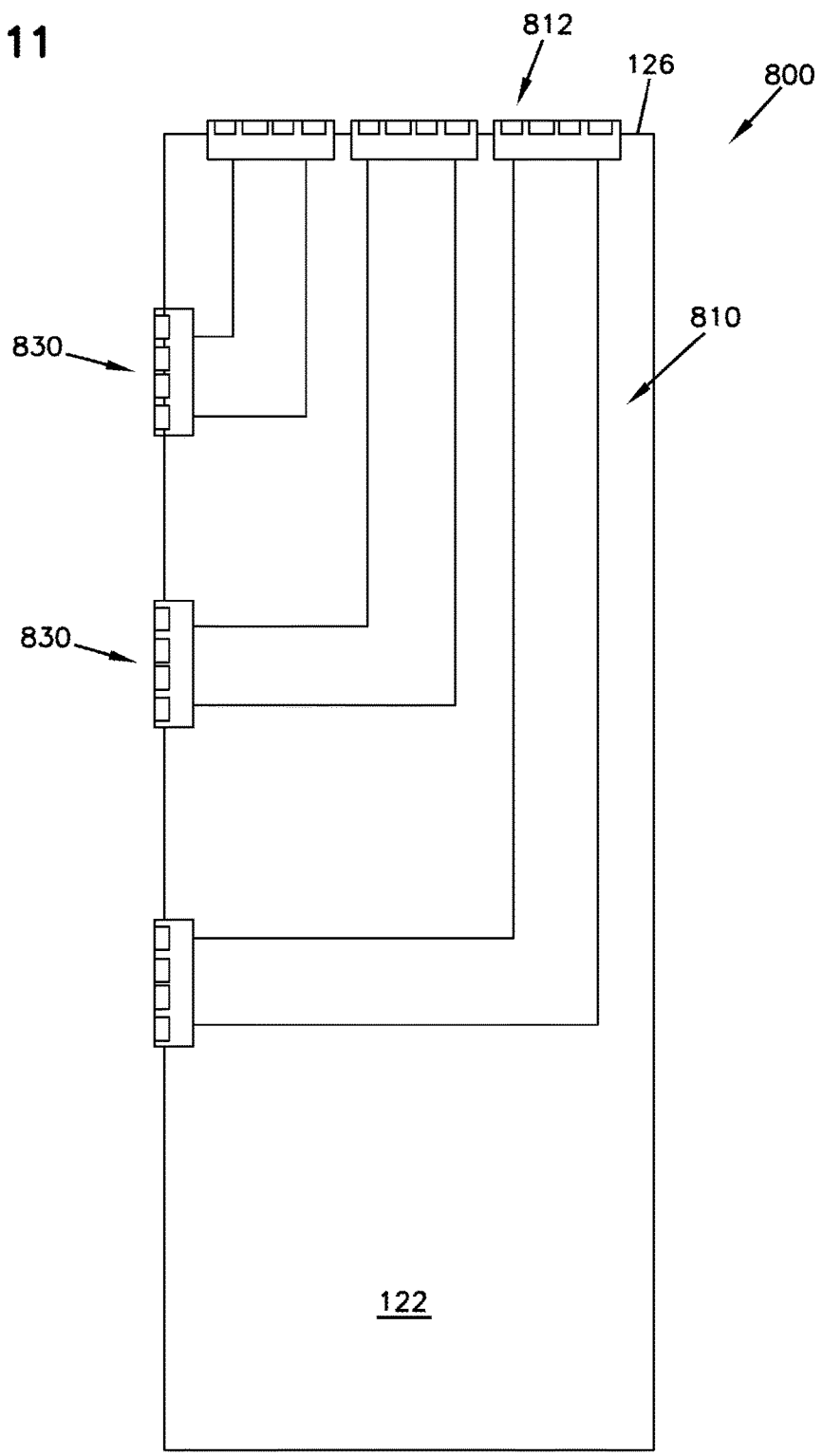
FIG. 11 is a side view of another example telecommunications cabinet.

Similarly, in FIG. 11, a telecommunications cabinet 800 includes modules 812 formed of rigid printed circuit boards (PCBs) with jacks attached thereto. Flexible PCB cabling 810 extends from the modules 812, through the side walls 122, 124, to modules 830. The modules 830 are again formed of rigid PCB boards having jacks attached thereto. In this example, the jacks on the modules 812 are MRJ21 jacks, and the jacks on the modules 830 are RJ45 jacks.

Figure 12:
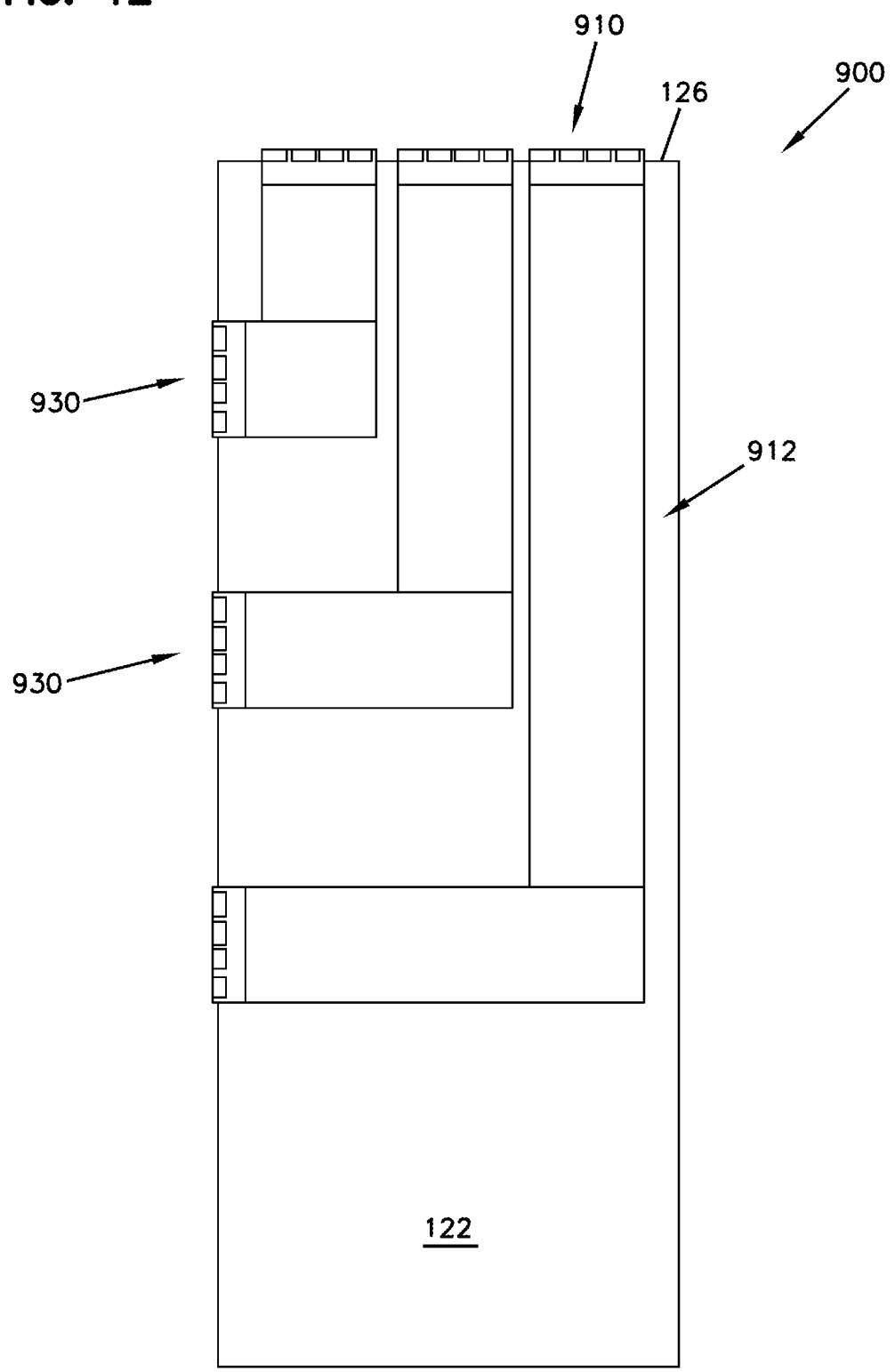
FIG. 12 is a side view of another example telecommunications cabinet.

In yet another embodiment shown in FIG. 12, an example telecommunications cabinet 900 includes modules 910, 930 and cabling 912, all formed of rigid PCB board. Data is electrically transmitted to/from the modules 910, 930. The rigid PCB board extends through the side walls 122, 124. Other configurations are possible.

There can be various advantages associated with the configurations described herein. For example, by providing the terminations at the outside of the cabinet, the amount of cabling run within the cabinet can be controlled to maximize thermal properties, such as cooling. Further, routing the cables through the side walls allows the cabinets to be "pre-wired" during assembly of the cabinets, thereby further optimizing cabling within the cabinets.

The routing of the cables in this manner also increases the density of the cabling that can be provided. The ribbon-like cabling allows for multiple layers of cable to be stacked, increasing the density of the cabling. Use of jumper cables of specified lengths also minimizes excess cabling (e.g., slack) within the cabinet, enhancing the thermal properties of the cabinet.

Further, termination of the ports outside of the cabinet minimizes the need to access the internal space of the cabinet for modifications, such as moves, adds, and changes (MAC). This results in a reduction for the need of patch panels and optimizes rack space for further equipment to be stored within the cabinet.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A telecommunications cabinet, comprising:
an enclosure including a top wall and exterior sidewalls defining an enclosure;
at least one interior sidewall spaced apart from one of the exterior sidewalls, with the at least one interior sidewall and the one of the exterior sidewalls defining a passage therebetween;
a plurality of ports located at the top wall of the enclosure; and
a plurality of cables extending from the plurality of ports and through the passage, wherein the plurality of cables are terminated at a plurality of second ports positioned along the at least one interior sidewall; and
a plurality of jumper cables running from the plurality of second ports to telecommunications equipment disposed within the enclosure.

2. The telecommunications cabinet of claim 1, wherein the plurality of ports are configured to accept fiber optic connectors.

3. The telecommunications cabinet of claim 1, wherein the plurality of ports are configured to accept electrical connectors.

4. The telecommunications cabinet of claim 1, wherein the plurality of ports are positioned on a module, the module being coupled to the top wall of the enclosure.

5. The telecommunications cabinet of claim 4, wherein the module is equipped with connection point identification technology.

6. The telecommunications cabinet of claim 4, wherein the module further includes one or more power ports.

7. The telecommunications cabinet of claim 6, wherein the one or more power ports are connect with electrical cables to the telecommunications equipment within the enclosure to provide power to the telecommunications equipment.

8. The telecommunications cabinet of claim 1, wherein the plurality of ports at the top wall are MTP ports, and the plurality of second ports are LC ports.

9. The telecommunications cabinet of claim 1, wherein the jumper cables are sized to minimize slack in the jumper cables.

* * * * *